United States Patent [19]

Carey

[11] Patent Number: 4,972,483
[45] Date of Patent: Nov. 20, 1990

[54] SPEECH PROCESSING SYSTEM USING ADAPTIVE VECTOR QUANTIZATION

[75] Inventor: Michael J. Carey, Woolaston, Near Lydney, England

[73] Assignee: Newbridge Networks Corporation, Ontario, Canada

[21] Appl. No.: 248,379

[22] Filed: Sep. 23, 1988

[30] Foreign Application Priority Data

Sep. 24, 1987 [GB] United Kingdom ............... 8722492

[51] Int. Cl.$^5$ .............................................. G10L 7/02
[52] U.S. Cl. ..................................................... 381/31
[58] Field of Search ................................... 381/29–41; 364/513.5; 375/122, 25–31

[56] References Cited

U.S. PATENT DOCUMENTS

| | | | |
|---|---|---|---|
| 4,720,861 | 1/1988 | Bertrand | 381/36 |
| 4,790,016 | 12/1988 | Mazor et al. | 381/36 |
| 4,791,654 | 12/1988 | DeMarca et al. | 381/29 |
| 4,811,398 | 3/1989 | Copperi et al. | 381/36 |
| 4,815,134 | 3/1989 | Picone et al. | 381/36 |

Primary Examiner—Gary V. Harkcom
Assistant Examiner—John A. Merecki

Attorney, Agent, or Firm—Antonelli, Terry, Stout & Kraus

[57] ABSTRACT

A speech processing system having an encoder comprising apparatus for receiving successive samples of PCM (pulse code modulated) encoded speech signals and apparatus, for applying sequential groups of the PCM encoded speech signals as primary vector signals to an encoder code book memory for selecting code words stored in the memory most closely approximating the vector signals. Apparatus is included for outputting to an output line the selected code words at a first bit rate. Further apparatus connects the selected code words to converted vector signals. The primary vector signals and converted vector signals are compared and difference signals result. The difference signals are quantized error signals are provided thereby. The quantized error signals are applied to the output line at the first or at a second bit rate to enable the processing system to transmit the speech signals at an effective bit rate constituting double the first bit rate or the sum of the first and second bit rate, or the quantized error signals is inhibited from being applied to the line. The processing system can thereby transmit the speech signals at an effective rate of the first bit rate thus incressing the traffic carrying capacity of the line.

19 Claims, 3 Drawing Sheets

SPEECH PROCESSING SYSTEM USING ADAPTIVE VECTOR QUANTIZATION

FIELD OF THE INVENTION

This invention relates to a speech processing system and in particular to a digital speech encoder and decoder which uses adaptive vector quantization, for use in voice and data multiplexed transmission systems.

BACKGROUND OF THE INVENTION

Efficient multiplexed transmission of digital speech and data signals in digital transmission systems requires encoding of the signals, prior to transmission over a transmission line. While there exist several encoding techniques, the encoding technique to which the present invention is directed is known as adaptive vector quantization. In adaptive vector quantization, the best fit for the pattern of each group of samples of successive groups of samples of pulse code modulated (PCM) encoded speech signals is found corresponding to previously stored groups of patterns in a code book, that is, in a memory which stores predetermined digital signal sequences of expected sample group patterns. Upon finding a best match, the entry number of the stored pattern in the memory is transmitted, rather than the pattern (the digital signal sequences) itself. At a decoder, a signal corresponding to the entry number of the best match pattern is applied to a code book memory in which is stored sample patterns identical to that in the code book memory of the encoder. Once the entry number has been entered, the pattern (or vector) signal is output and is and converted to a PCM signal corresponding approximately to the original input PCM signal.

Vector quantization coding systems have herefore not been fully developed because of the existence of several problems. For example the larger the number of bits per sample, and the larger the number of samples per group of samples or (or vector, sometimes referred to as the dimension), the larger must be the code book memory. The larger the memory is the longer is the best fit search time. For reasonably high transmission rates and signal resolution which would not degrade the resultant intelligibility of the speech signal, it had been found that the processing time of economically priced processors is excessive. In order to transmit signals at costs competitive with other encoding techniques, low resolution signals were required to be transmitted, resulting in poor speech reproduction at the receiving end of the transmission system.

One of the techniques used to increase the resolution is to utilize two code book memories in series. A coarse resolution vector code book memory lookup of a first code book memory is first conducted, followed by a second, of a second code book memory, in time sequence. The result is the provision of a high resolution code word (which term is used herein synonymously with the term table lookup entry number). However while decreasing memory size, the use of two memories slows down the lookup time, and utilizes substantial processor capacity. Thus additional processor capacity must be provided for the system, increasing its cost.

In the present invention only a single initial encoder code book memory is required, and a highly efficient search technique is used, thereby incurring minimum code book lookup time.

The resulting code book entry number is converted back to a vector signal and is compared with the primary vector signal. The difference, which constitutes an error, is scalar or vector quantized and is transmitted to the decoder in a separate channel. In the case of low traffic on the transmission line, both the code book entry and the error signal are transmitted to the decoder, resulting in a high resolution transmission rate, e.g., 32 Kb/S. However once the system has been loaded above a predetermined threshold, the error signals are not transmitted. The code words are thus transmitted at their normal rate of e.g. 16 Kb/S, i.e. at lower resolution, but doubling the capacity of the transmission line, assuming that all multiplexed signals carried by the transmission line switch to lower resolution at the same time.

Indeed for a multiplexed system the channels can be graded, with certain channels reverting to 16 Kb/S at a higher energy threshold than others. The system can also eliminate transmission of the error signals channel by channel as traffic builds up, adapting the resolution of the signals transmitted, and the capacity of the system, as traffic increases or decreases.

At the decoder the code words are translated into PCM encoded speech signals, which are modified by the quantized error signals into higher resolution signals if the quantized error signals have been received, or remain at lower resolution if the error signals have not been received.

Accordingly a high efficiency processing system has been invented which can dynamically change its transmission capacity from higher resolution signals at a lower capacity to lower resolution signals at higher capacity.

The above embodiments, as well as others to be described below, provide a highly effective vector quantized signal processing system which has been found to be cost effective, efficient, and results in received signals having high intelligibility.

DESCRIPTION OF THE PRIOR ART

Vector quantization has been described in the publications "Vector Quantization" by Robert M. Gray, IEEE ASSP Magazine, April 1984, p. 4–29; "Vector Quantization: A Pattern-Matching Technique For Speech Coding" by Allen Gersho and Vlidimir Cuperman, IEEE Communications Magazine, p. 15–21; "A Continuously Adaptive Vector Predictive Coder (AVPC) For Speech Encoding" by Enrique Masgrau et al, ICASSP 86, Tokyo, P. 3027–3030; "Vector Predictive Coding of Speech at 16 kbits/s" by Vladimir Cuperman and Allen Gersho, IEEE Transactions on Communications, vol. com-33, No. 7, July 1985, p. 685–696; and "A Fast Codebook Search Algorithm For Nearest-Neighbor Pattern Matching" by De-Yuan Cheng and Allen Gersho, ICASSP 86, Tokyo, p. 265–268. Adaptive prediction in speech differential encoding systems is described in general in the article "Adaptive Prediction In Speech Differential Encoding Systems" by Jerry D. Gibson, Proceedings of the IEEE, Vol. 68, No. 4, April 1980, p. 488–524. Other informative articles are concerning the subject "A Robust Adaptive Quantizer" by David J. Goodman and Roger M. Wilkinson, IEEE Transactions on Communications, November 1984, p. 1362–1365, an article by David J. Goodman and Allen Gersho in the IEEE Transactions on Communications, August 1974, p. 1037–1045; "PCM Codecs For Communication" by Karl Euler, IEEE Proc. ISCAS/76, p.

583–586; "Design Approaches for a PCM-CODEC Per Channel" by A. Rijbroek, IEEE PROC. ISCAS/76, p. 587–590; "Adaptive Lattice Analysis of Speech, by John Makhoul and Lynn Cosell", Feb. 1981 joint issue of the IEEE Trans. Circuits and Systems and Trans. Acoustics, Speech, and Signal Processing, March 1980; and "An Adaptive Lattice Algorithm for Recursive Filters", by D. Parikh et al, IEEE Transactions on Acoustics, Speech, and Signal Processing, Vol. ASSP-28, No. 1, February 1980. p. 110–111. All of the above articles are incorporated here in by reference.

SUMMARY OF THE INVENTION

In general, one embodiment of the present invention is a speech processing system having an encoder comprising apparatus for receiving successive samples of PCM encoded speech signals, apparatus for applying sequential groups of the PCM (pulse code modulated) encoded speech signals as primary vector signals to an encoder code book memory for selecting code words stored in the memory most closely approximating the vector signals, and apparatus for outputting to an output line the selected code words at a first bit rate. Apparatus is included for converting the selected code words to converted vector signals and for comparing the primary vector signals and converted vector signals and for providing difference signals therefrom. Apparatus is included for quantizing the difference signals and for thereby providing quantized error signals. Further apparatus applies the quantized error signals to the output line at the first or at a second bit rate to enable the processing systems to transmit the speech signals at an effective bit rate constituting double the first bit rate or the sum of the first and second bit rate, or inhibits the quantized error signal from being applied to the line to enable the processing system to transmit the speech signals at an effective bit rate of the first bit rate, thus increasing the traffic carrying capacity of the line.

It is preferred that the second bit rate (of the error signal) should be equal to the first bit rate (of the code words, i.e. the code book entry number) in order that the error signals should correspond on a one-to-one basis with the corresponding code words. However under some circumstances it may be desirable to transmit the error signals at a less frequent rate, whereby the traffic carrying capacity of the transmission line is graded at a higher rate of resolution, thus increasing or decreasing the traffic carrying capacity of the transmission line in smaller steps. Thus the effective transmission bit rate would be the sum of the bit rate of the selected code word transmission plus the bit rate of the quantized error signals.

Another embodiment of the invention is a speech processor for receiving successive samples of PCM input signals and scaler quantized error signals comprising a plurality of speech encoders for vector quantization of PCM input signals, each providing output signals comprising a code book entry signal corresponding to a group of samples of the PCM input signals and corresponding scalar quantized error signals, a multiplexer for multiplexing all of the code book entry signals and error signals, for transmission to a decoder, apparatus for sensing demands for transmission of additional digital signals, apparatus for progressively eliminating the error signals from being multiplexed in the multiplexer and for substituting the additional signals in place thereof as the demands increase, whereby the capacity of the processor to transmit code book entry signals and the additional signals is progressively increased while decreasing the resolution of multiplexed transmission of the PCM input signals.

It should be noted that the term transmission of the selected code words is used herein synonymous with transmission of the entry number of the best matched code word in the code book memory. This is of course a digital signal corresponding to the code book entry number, (i.e. which would correspond to the address) in the code book memory which is transmitted at the selected code word.

A hyperplane search technique is preferred to be used. Hyperplane searching is described in the aforenoted Cheng and Gersho publication. With the use of a modification of this technique, the resulting code book memory lookup interval is very fast, allowing efficient 16 Kb/S operation using an inexpensive TMS320C25 digital signal processor. The apparatus can also be realized in integrated circuit form.

BRIEF INTRODUCTION TO THE DRAWINGS

A better understanding of the invention will be obtained by reference to the description below of a preferred embodiment of the invention, in conjunction with the following drawings, in which.

DESCRIPTION OF THE PREFERRED EMBODIMENTS

Figure 1:
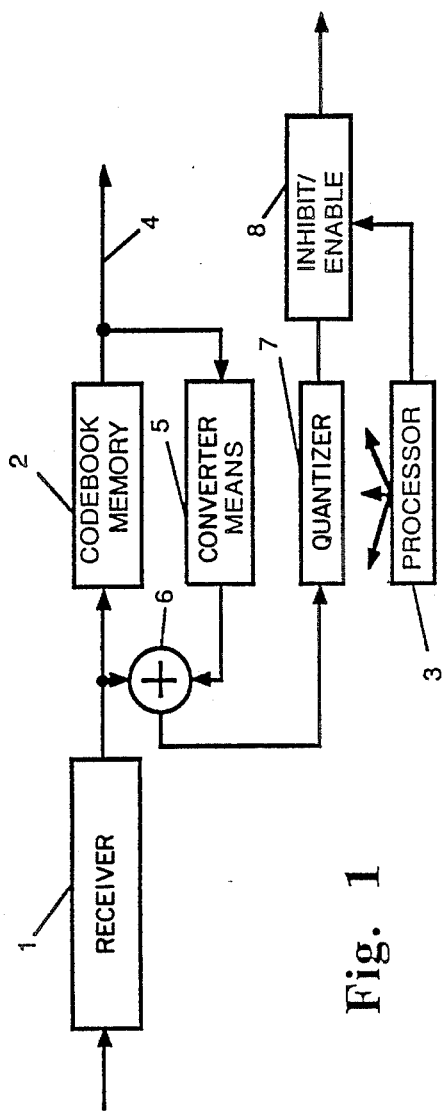
FIG. 1 is block diagram of the invention in broad form.

Referring now to FIG. 1, at an input PCM IN, input signals comprised of previously PCM encoded speech samples are received. Typically the speech will have been encoded using A-LAW or u-LAW, at 8 bits per sample of speech, sampled at 8 Kb/S.

The PCM encoded speech signals are received in a receiving apparatus which filters the signal as will be described in more detail below. Groups of sample signals from the receiving apparatus, resulting from the speech signals, called vectors, are applied to a code book memory 2, which has stored in it an array of representative vectors. Under control of processor 3 the code book memory is scanned for a best fit match of the stored representative vector signals for each input vector. Once it has been located a signal corresponding to the code book entry number of the best fit matched vector (i.e. corresponding to its address) is output to a transmission line 4 for transmission to a decoder.

According to the present invention the code book entry number (or code word) is converted in a converting apparatus 5 back to a vector, i.e. to a group of samples. This is compared in a comparing apparatus 6 with the input or primary vector, and the difference is applied to a scalar or vector quantizer 7. It is preferred that the comparison should be conducted in the comparing apparatus 6 on a sample by sample basis, rather than on a group basis, in order to increase the accuracy of the error signal. The quantizer 7 performs a scalar 2 bit or vector quantization, and outputs quantized error signals.

As will be described later, at the decoder the code book memory best fit entry number of code words and the quantized error signals received from the encoder are combined and are converted to a high resolution PCM encoded speech signal. In the event the quantized error signals are not sent, the decoder translates the code words into lower resolution PCM encoded speech signals.

By controlling operation of each encoder in a multiple channel system, the processor 3 senses the energy content of the signals which are to be transmitted over the transmission line, and determines whether the energy content exceeds a predetermined threshold. If the energy level does not exceed the threshold, the quantized error signals on at least one channel, e.g., the one described herein, are inhibited from being transmitted. To illustrate the inhibition function, processor 3 is shown operating an inhibit/enable gate 8, which allows transmission of the quantized error signal or inhibits its transmission to the transmission line or multiplexer. However it should be clear that the processor can merely inhibit operation of quantizer 7 itself or, where the quantization and/or comparison is effected by the processor, it can merely not carry out the signal comparison, thus eliminating the generation of error signals or quantized error signals, and allowing the increased channel capacity to be used to transmit code words of other channels.

Thus according to the invention as shown in FIG. 1 a speech processing system is realized having dynamically variable channel capacity with high resolution and lower capacity, or lower resolution and higher capacity capabilities.

Figure 2:
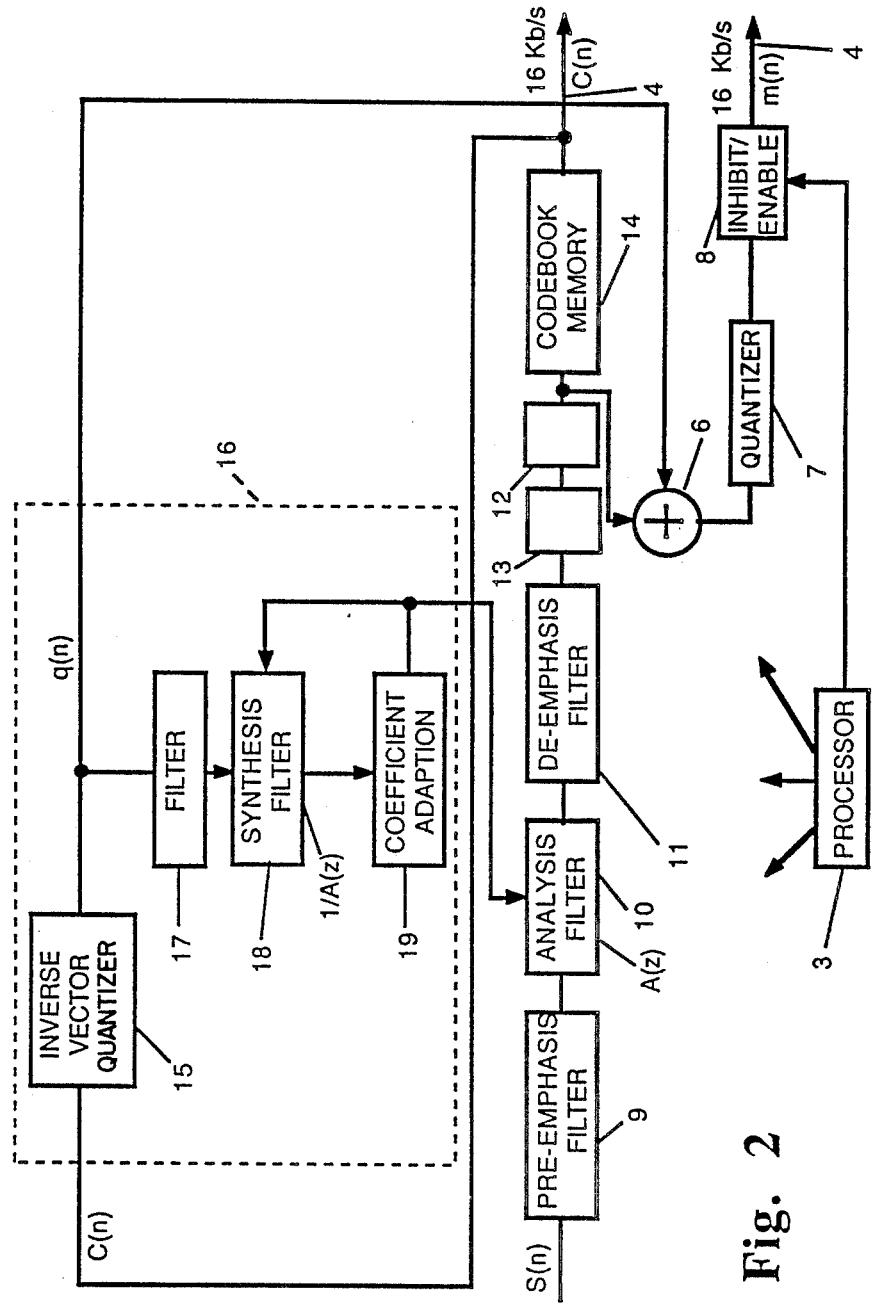
FIG. 2 is a block diagram of an encoder in more detailed form.

Turning now to FIG. 2, a more detailed representation of the encoder is shown. The PCM encoded speech signals are preferably converted (externally) to linear form and are applied to a pre-emphasis filter 9 as signal S(n). This is preferably a first order FIR filter, having a single coefficient, typically 0.4. The pre-emphasized sample is then passed into a forward adaptive analysis filter 10 which flattens the spectrum and reduces the average amplitude of the signal. The analysis filter is preferably lattice in form, which, as is well known, generates forward and backward error signals and requires the inputting of coefficients in order to define the filter characteristics.

The signal output from the analysis filter 10 is passed through a smoothing or de-emphasis filter 11 which makes it more suitable for operation by the vector quantizer, comprised of the code book memory 14. Successive groups of samples output from the de-emphasis filter 11 are formed in a vector former 12, which outputs primary vector signals, after having their gain normalized in a gain normalizer 13. The quantizer selects the best matched code word to the primary vector from a code book memory 14. Output signals from the code book memory are code words corresponding to the entry number of the best matched vector to the primary vector signals within the code book memory. Preferably the Euclidian distance measurement between the primary vector and code word in the memory should be used to obtain the best match. The code words C(n) are applied to transmission line 4 (via a multiplexer) at e.g., a 16 Kb/S rate.

It is desirable to control the gain prior to application of the primary vector signals to the code book memory to place the primary vector signals in the middle of the range so as to make better use of the vector values. A preceding energy level determined in the processor 3 is preferred to modify the gain in order to place the amplitudes of the primary vector signals in the middle gain range. At the decoder the sum of the squares of the reconstituted vector signals is used to retrieve the energy level and thereby modify the gain of the output signals.

The code words output from the code book 14 are applied to an inverse vector quantizer 15. The inverse quantizer reconstitutes the gain (energy level) of the primary vector signals as described above, and using the code word, accesses the vector signals stored in a second code book memory in the inverse vector quantizer, which code book memory is identical to code book memory 14. The resulting signal (referred to herein as a converted vector signal) corresponds to the primary vector signal plus an error (which can in some circumstances be as little as zero).

The converted vector signals q(n) output from inverse vector quantizer 15 are applied to a comparing means 6, to which the primary vector signals output from the vector former 12 are also applied. The comparing means 6 subtracts the two and generates a difference signal which is applied to quantizer 7. The quantized error signal from quantizer 7 is applied to transmission line 4 (through the aforenoted multiplexer). The signal is either applied or inhibited from being applied to transmission line 4 through gate 8 as described earlier with respect to FIG. 1, under control of processor 3.

The inverse vector quantizer, with further apparatus to be described below, and shown within the dashed line block 16, forms a local decoder, which is used to form the lattice filter coefficients. The converted vector signals are passed through a pre-emphasis filter 17, to compensate for the effect of the smoothing filter 11. The output of the pre-emphasis filter is applied to synthesis lattice filter 18, which reconstructs an approximation to the input speech signal. The forward and backward error signals generated by the lattice filter are transferred to a coefficient adaption apparatus 19 which re-estimates the value of the lattice filter coefficients after the vector has been applied to the synthesis filter. These filter coefficients are applied to the analysis filter 10 for each of the samples in the group which will form the next input primary vector signal.

Figure 3:
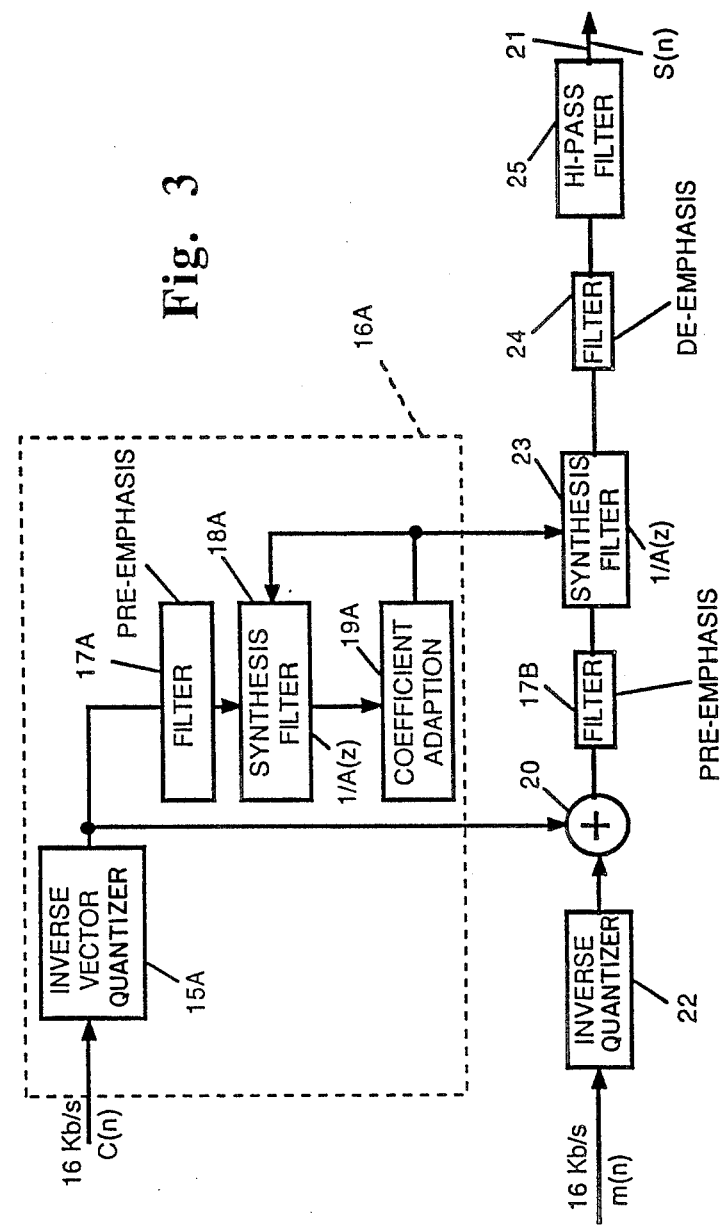
FIG. 3 is a block diagram of a decoder in more detailed form.

Turning now to FIG. 3, a decoder in accordance with the preferred embodiment of the invention is shown. Part of the decoder, 16A, is identical to the local decoder 16 in the encoder. The elements 15, 17, 18 and 19 in FIG. 2 correspond to and are identical to elements 15A, 17A, 18A and 19A in FIG. 3. Making the remote decoder identical to the local decoder ensures that both the encoder and the remote decoder produces the same set of lattice filter coefficients, so that tracking is maintained between the two.

The code words C(n) are received at the transmitted rate of 16 Kb/S at inverse vector quantizer 15A. As described with reference to FIG. 2, the code book memory in inverse vector quantizer 15A which is identical to the one in inverse vector quantizer 15 and memory 14 is accessed using the received code words, and the resulting signal output therefrom forms converted vector signals, which are formed by a set of samples corresponding to those chosen by the encoder as being closest to the gain normalized and filtered primary vector signals. The gain of the converted vector signals is then reconstituted in the inverse vector quantizer using the inverse of the gain normalizing criteria or algorithm used in gain normalizer 13. The signal is pre-emphasized in pre-emphasis filter 17A as described with respect to the corresponding element in FIG. 2, and is applied to synthesis lattice filter 18A, which reconstructs an approximation to the input speech signal. The forward and backward error signals generated by the lattice filter are transferred to a coefficient adaption apparatus 19A, which uses the error signals to re-estimate the value of the lattice filter 18A coefficients after each sample in the vector has been applied to synthesis filter. The coefficients are applied to synthesis filter 23.

The reconstructed vector signals pass through an adder 20, and are applied as output signals S(n) to an output line 21, at 16 Kb/S.

The error signals m(n) at 16 Kb/S are received from the transmission line and are applied to scalar or vector quantizer 22. The sum of the dequantized error signals added to the reconstructed vector signals in adder 20 are applied through filter 17B, which is identical to filter 17A, and which corrects for initial pre-emphasis in the encoder. The resulting signals are applied through filter 23, which is identical to filter 18A, to modify the 16 Kb/S output signal from filter 17B into more precise form. The coefficients of filter 23 are controlled by the coefficient adaption logic 19A, and are hence identical to the coefficients of filter 18A. After passing through a de-emphasis filter 24, and high pass filter 25, the reconstituted original primary vector signal S(n) thus results on output 21, from which the vector signals can be encoded into A-LAW or u-LAW PCM signals for use external to this system.

It should be noted that the effective bit rate (resolution) of the error corrected output signals is 32 Kb/S. However in the absence of the error signal m(n), no error correction signal will be applied to adder 20, and the signal at output 21 will be at the lower resolution 16 Kb/S, but allowing the system to operate with higher loading capacity.

It should be noted that in addition to the transfer of the forward and backward error signals from the synthesis filter to the coefficient adaption apparatus, the backward error signal from the synthesis filter in the encoder should be combined with that of the analysis filter in the encoder so that part of the noise caused by the quantization process is cancelled. This tends to whiten the noise giving it a spectrum which is nearer to a flat spectrum. Otherwise the output spectrum from this form of encoder would have the same spectral shape as the signal which it is processing.

In order to adapt the filters, generation of two signals is effected, one of which is the exponentially weighted cross correlation between the backward error and the forward error at the last stage of the filter:

$$v_i(n) = \gamma N_i(n-1) + v(1-\gamma) f_i(n) b_{i-i}(n-1)$$

and the second signal:

$$y_i(n) = y_i(n-1) + (1-\gamma) fi^2(n) bi^2 - (n+)$$

is a normalization signal which consists of an exponentially weighted square of each of the above two noted signals. The first signal is normalized by the second signal to give a correction factor which should be used to update the lattice filter coefficient which is using the equation shown below: ( $$K_i(n) = d\ K_i(n-1) + B(-\gamma) v_i(n) / y_i(n)$$

Typical values for the variables are $\gamma = 0.96$, $\alpha = 0.936$, $\beta = 1.5$ and $\sigma = 2(\ldots 2(1 - \gamma f_n(n) b_{y-i}(n-1)))$.

In the code-book lookup process, the sum of the squares of the Euclidian distance between the current value of the vector just looked up in the table and the actual value of the vector being looked up is determined. The sum of the squares of the difference between the current value of the vector looked up and the next vector to be checked is determined. If the different is less than the aforenoted difference, then the current value of the vector looked up in the table should be used as the selected vector. If it is not less, then the next vector must be checked. Preferably a hyperplane splitting technique for searching for corresponding vectors in the code book memory is preferred to be used. The fundamental concept of this technique is described in the aforenoted article by De-Yuan Cheng and Allen Gersho, and repetition at this point would be redundant. However it is preferred that a modification should be used.

The code book memory itself in the present invention should contain eight sets of vectors for the reason described below. At each stage in the search tree the normalized input vectors are correlated with a vector which lies orthogonal to a hyperplane which divides the vectors in the code book into two sections in the hyper space. Tests to determine which of the code word sets is to be further searched. When this has been determined the code words are searched and the closest match to the normalized input vector is taken to be that code word with the minimum Euclidian distance between itself and the input vector.

In the method of Cheng and Gersho, the hyperplane selected for splitting the set of vectors is essentially random, the position of the hyperplane being determined by perturbing the centroid of the previous set. In the preferred process, rather than splitting the data through an arbitrary hyperplane and then correlating the incoming data with a vector perpendicular to the hyperplane, a hyperplane which is perpendicular to one element in the data set is chosen, the first split being determined by the element which is the first in the data set. The second split is determined in each case by the element which is second in the data set. Therefore only the size of each element need be considered to determine which side of the hyperplane in which this particular vector will be. When constructing the sets of vectors, a threshold along the element being tested should be chosen which will divide the set exactly in two. An even search tree results, with 8 brackets or sets of 48 vectors. A computational cost less than that achieved by Cheng and Gersho results.

Associated with each code word there is a code word energy value. If the value of the energy is less than a preset threshold, then the gain parameter is decayed; if the energy value is greater than unity, the gain adjustment value is increased by an amount which is proportional to the size of the energy value.

Figure 4:
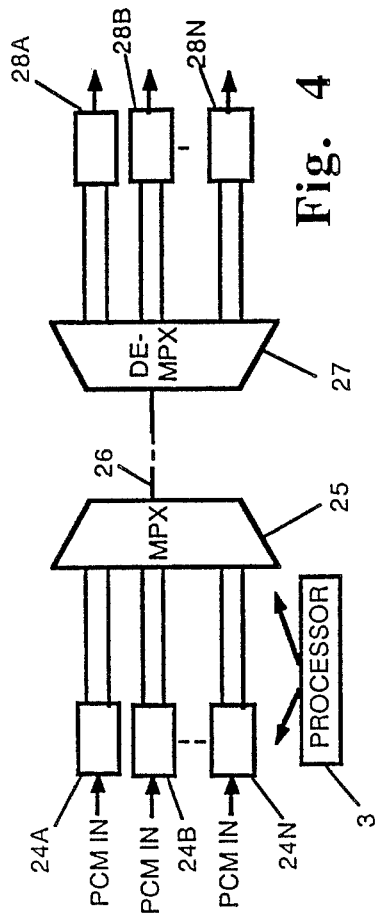
FIG. 4 is a block diagram of a multi-encoder system according to a further embodiment.

FIG. 4 illustrates a block diagram of a variable loading transmission system in accordance with the invention. A plurality of encoders 24A, 24B . . . 24N, each similar to the one described with reference to FIG. 2 output on separate lines the code word signals and the error signals into separate channel inputs of a multiplexer 25. The encoders and the multiplexer are operated under control of processor 3, although separate processors can be used. A transmission line 26, which can of course be formed of various transmission media, interconnects the output of multiplexer 25 and the input of demultiplexer 27. Individual channel outputs of demultiplexer 27 are connected to decoders 28A, 28B... 28N, each of which has a channel output.

The capacity of the transmission line 26 may be utilized in various ways. However in order to illustrate the invention, one particular way of implementing the invention will be described.

Let us assume that the channel capacity of transmission line 26 is 120 16 Kb/S channels. Given that there are 120 PCM input lines to 120 encoders 24A-24N, seldom would all be used at the same time. Therefore with up to 60 PCM input signals arriving at encoders 24A-24N, 60 signals constituting code words will be input to multiplexer 25 as well as 60 corresponding 16 Kb/S scalar or vector quantized error signals.

Under control of processor 3, multiplexer 25 assigns the code word signals and error signals to separate 16 Kb/S channels, time multiplexes them, and transmits them on transmission line 26 in 120 channels.

At the receiving end of transmission line 26, the signals are demultiplexed in demultiplexer 27, and are separated into code word signals and corresponding error signals on separate pairs of lines for each of 60 of the 120 decoders 28A-28N. The decoders combine the code words and error signals as described earlier and output the signals on their respective output lines. However it should be noted that with the combined error signals, the effective bit rate for the signals on the output lines is 32 Kb/S, i.e. high resolution.

Assume now that one additional PCM input signal is to be transmitted. Processor 3 senses that it is to be transmitted and inhibits either generation of the error signal from one encoder, or transmission of the error signal to multiplexer 25, or multiplexing of the error signal from that one encoder, creating a spare 16 Kb/S channel. It is preferred that the error signal from the one channel should not be created and therefore does not arrive at multiplexer 25.

Multiplexer 25 now substitutes the 16 Kb/S code word signal from the encoder of the 61st PCM signal in place of the deleted error signal.

At the demultiplexer the error signal corresponding to the code word from which it was deleted does not exist, and therefore the corresponding decoder decodes the code word and outputs it at 16 Kb/S resolution, as described earlier. The 61st channel signal is similarly decoded and is outputted as a 16 Kb/S.

In this manner increasing the demand for service will cause successive removal of error signals in favour of increased capacity for additional code word signals at low resolution, dynamically variable. Different input signal lines can be allocated different classes of service, thus allowing signals for which high resolution is most important to be maintained permanently, if desired, or to be maintained if the system is almost fully loaded to 120 channels.

A system has thus been described which for example when lightly loaded can be used in conjunction with other similar systems to provide e.g., 60 channels at 32 Kb/S when lightly loaded, and up to 120 channels at 16 Kb/S. As the system becomes loaded the processor can eliminate transmission of the error signals channel by channel, allowing the transmission line to increase in capacity channel by channel from 60 to 120 channels as additional channels are required. In addition, by considering the gain (energy) value in the local processor, if the energy is zero, i.e. silence being transmitted, no error signal is required, and that channel can be transmitted at 16 Kb/S, increasing the capacity. By dynamically sensing which channels are transmitting silence, and by eliminating error signals for those channels during those intervals, the apparent capacity of the system to carry signals at 32 Kb/S can be clearly increased. By dynamically allocating channels to various input signals high efficiency of the transmission facility may thus be obtained.

The above description has been made with reference to a speech processing system. However it should be noted that the system can be used to transmit both voice and data digital signals. The system can be implementing using integrated circuits or can be realized in a general or special purpose digital signal processing device.

While the preferred embodiment of the invention has been described above, it will be realized that variations and other embodiments may be made utilizing the principles described herein. All are considered to be within the sphere and scope of the invention as defined in claims appended hereto.

I claim:

1. A speech processing system having an encoder comprising:
   (a) means for receiving successive samples of PCM (pulse code modulated) encoded speech signals,
   (b) means for applying sequential groups of said PCM encoded speech signals as primary vector signals to an encoder code book memory for selecting code words stored in said memory most closely approximating said vector signals,
   (c) means for outputting to an output line said selected code words at a first bit rate,
   (d) means for converting said selected code words to converted vector signals,
   (e) means for comparing the primary vector signals and converted vector signals and for providing difference signals therefrom,
   (f) means for quantizing the difference signals and for providing quantized error signals therefrom,
   (g) means for applying the quantized error signals to the output line at the first or at a second bit rate for enabling the processing system to transmit said speech signals at an effective bit rate constituting either double the first bit rate or the sum of the first and second bit rate, or for inhibiting the quantized error signals from being applied to the line whereby the processing system can transmit said speech signals at an effective rate of the first bit rate thus increasing traffic carrying capacity of the line.

2. A speech processor as defined in claim 1 in which the receiving means is comprised of an adaptive analysis filter having its transfer characteristics defined by a plurality of coefficient signals, and further including means for generating converted PCM encoded speech signals from the converted vector signals comprising an adaptive synthesis filter which is the analog of the adaptive analysis filter, for receiving the converted vector signals, filter coefficient signal generating means for receiving the converted vector signals and the converted PCM encoded speech signals and for generating and applying corresponding filter coefficients to the synthesis and analysis filters whereby the synthesis and analysis filters are rendered as analogous as possible.

3. A speech processor as defined in claim 2 in which the synthesis and analysis filters are lattice filters, the filter coefficient signal generating means including means for generating a new set of filter coefficient signals after each sample of said PCM encoded speech signal.

4. A speech processor as defined in claim 3 in which the receiving means is comprised of means for receiving the PCM encoded speech signals in linear form, pre-emphasis filter means for pre-emphasizing the linear form of PCM encoded speech signals, said adaptive analysis filter for receiving the pre-emphasized signals, flattening their spectra and reducing their average amplitudes, and smoothing filter means for smoothing the adaptive analysis filtered signals, and for providing the smoothed signals to the sequential group applying means.

5. A speech processor as defined in claim 4 further including means for normalizing the gain of the samples of the smoothed signals interposed between the smoothing filter means and the sequential group applying means.

6. A speech processor as defined in claim 1, 2 or 5 in which the comparing means includes means for determining the difference between each sample of each primary vector signal and each sample of a corresponding converted vector signal to provide said deference signal.

7. A speech processing system as defined in claim 5, in which the comparing means includes means for determining the difference between each sample of each primary vector signal and each sample of a corresponding converted vector signal to provide said difference signals, and a decoder comprising:
 (a) means for receiving said selected code words and said quantized error signals from the output line,
 (b) a decoder code book memory containing a table of code words identical to that of the encoder code book memory,
 (c) means for applying the selected code words to the decoder code book memory and for obtaining best matched vector signals stored herein corresponding to the selected code words, p1 (d) means for converting the best matched vector signals into sequential samples of PCM encoded speech signals for output from the processing system.
 (e) means for dequantizing the quantized error signals and adding the dequantized error signals to the best matched vector signals in the event of receipt of said error signals to form corrected vector signals,
 (f) means for filtering the corrected vector signals for restoring the gain of the corrected signals to correspond to that of the PCM encoded speech signals, and
 (g) means for encoding the gain corrected signals into PCM speech signals and for outputting the encoded signals from the decoder.

8. A speech processor as defined in claim 3, 4 or 7 in which the comparing means includes means for determining the difference between each sample of each primary vector signal and each sample of a corresponding converted vector signal to provide said difference signal, the synthesis filter and the analysis filter including means for generating backward error signals, and means for combining the backward error signals generated in the synthesis filter with the backward error signals generated in the analysis filter, thereby cancelling part of the noise caused by quantization and flattening the spectrum of the selected code words applied to the line relative to the received PCM encoded speech signals.

9. A speech processing system as defined in claim 3 or 4, in which the comparing means includes means for determining the difference between each sample of each primary vector signal and each sample of a corresponding converted vector signal to provide said difference signals, and a decoder comprising:
 (a) means for receiving said selected code words and said quantized error signals from the output line,
 (b) a decoder code book memory containing a table of code words identical to that of the encoder code book memory,
 (c) means for applying the selected code words to the decoder code book memory and for obtaining best matched vector signals stored therein corresponding to the selected code words,
 (d) means for converting the best matched vector signals into sequential samples of PCM encoded speech signals for output from the processing system.

10. A speech processor as defined in claim 4 further including means for normalizing the gain of the samples of the smoothed signals interposed between the smoothing filter means and the sequential group applying means, and in which the comparing means includes means for determining the difference between each sample of said gain normalized primary vector signal and each sample of a corresponding converted vector signal to provide said difference signals.

11. A speech processor as defined in claim 10 in which the synthesis and analysis filters are lattice filters, the filter coefficient signal generating means including means for generating a new set of filter coefficient signals after selection of each vector signal.

12. A speech processor as defined in claim 11 in which the receiving means is comprised means for receiving the PCM encoded speech signals in linear form, pre-emphasis filter means for pe-emphasizing the linear form of PCM encoded speech signals, said adaptive analysis filter for receiving the pre-emphasized signals, flattening their spectra and reducing their average amplitudes, and smoothing filter means for smoothing the adaptive analysis filtered signals, and for providing the smoothed signals to the sequential group applying means.

13. A speech processor as defined in claim 12 further including means for normalizing the gain of the samples of the smoothed signals interposed between the smoothing filter means and the sequential group applying means.

14. A speech processor as defined in claim 13 in which the comparing means includes means for determining the difference between each sample of each primary vector signal and each sample of a corresponding converted vector signal to provide said difference signal, the synthesis filter and the analysis filter including means for generating backward error signals, and means for combining the backward error signals generated in the synthesis filter with the backward error signals generated in the analysis filter, thereby cancelling part of the noise caused by quantization and flattening the spectra of the selected code words applied to the line relative to the received PCM encoded speech signals.

15. A speech processing system for receiving successive samples of PCM (pulse code modulated) input signals and corresponding scalar quantized error signals comprising:

(a) a plurality of speech encoders for vector quantization of said PCM input signals, each providing output signals comprising a code book entry signal corresponding to a group of samples of said PCM input signals and corresponding scalar quantized error signals, (b) a multiplexer for multiplexing all of the code book entry signals and error signals for transmission to a decoder, (c) means for sensing demands for transmission of additional digital signals, and p1 (d) means for progressively eliminating the error signals from being multiplexed in the multiplexer and for substituting said additional signals in place thereof as said demands increase, whereby the capacity of the processing system to transmit code book entry signals and said additional signals is progressingly increased while decreasing the resolution of multiplexed transmission of the PCM input signals.

16. A speech processor as defined in claim 16, in which each of the speech encoders is comprised of:

(a) means for receiving successive samples of PCM (pulse code modulated) encoded speech signals, (b) means for applying sequential groups of said PCM encoded speech signals as primary vector signals to an encoder code book memory for selecting code words stored in said memory most closely approximating said vector signals, (c) means for outputting to an output line said selected code words at a first bit rate, (d) means for converting said selected code words to converted vector signals, (e) means for comparing the primary vector signals and converted vector signals and for providing difference signals therefrom, (f) means for quantizing the difference signals and for providing quantized error signals therefrom, (g) means for applying the quantized error signals to the output line at the first or at a second bit rate for enabling the processing system to transmit said speech signals at an effective bit rate constituting either double the first bit rate or the sum of the first and second bit rate, or for inhibiting the quantized error signals from being applied to the line whereby the processing system can transmit said speech signals at an effective rate of the first bit rate thus increasing traffic carrying capacity of the line.

17. A speech processor as defined in claim 19 further including means for normalizing the gain of the samples of the smoothed signals interposed between the smoothing filter means and the sequential group applying means, and in which the comparing means includes means for determining the difference between each sample of said gain normalized primary vector signal and each sample of a corresponding converted vector signal to provide said difference signals.

18. A speech processor as defined in claim 16, in which each of the speech encoders is comprised of means for digitally encoding a plurality of input signals into a corresponding plurality of first low resolution signals for transmission in a first group of channels, and for encoding a corresponding group of error signals for transmission in a second group of channels for subsequent receipt by a decoder whereby the error signals can be combined with corresponding low resolution signals into high resolution (high equivalent bit rate) output signals, means for substituting additional low resolution encoded input signals in one or more of said second group of channels in place of said error signals for subsequent decoding of the additional low resolution signals into additional output signals, and substituting of the original low resolution signals corresponding to the error signals into low resolution output signals.

19. A speech processor system comprising means for digitally encoding a plurality of input signals into a corresponding plurality of first low resolution (low bit rate) signals for transmission in a first group of channels, and for encoding a corresponding group of error signals for transmission in a second group of channels for subsequent receipt by a decoder whereby the error signals can be combined with corresponding low resolution signals into high resolution (high equivalent bit rate) output signals, means for substituting additional low resolution encoded input signals in one or more of said second group of channels in place of said error signals for subsequent decoding of the additional low resolution signals into additional output signals, and substituting of the original low resolution signals corresponding to the error signals into low resolution output signals.

* * * * *